United States Patent [19]

Shioya et al.

[11] Patent Number: 4,645,713
[45] Date of Patent: Feb. 24, 1987

[54] METHOD FOR FORMING CONDUCTIVE GRAPHITE FILM AND FILM FORMED THEREBY

[75] Inventors: Jun Shioya; Yoichi Yamaguchi; Yoshinobu Ueba; Hironaga Matsubara, all of Osaka, Japan

[73] Assignee: Agency of Industrial Science & Technology, Tokyo, Japan

[21] Appl. No.: 822,244

[22] Filed: Jan. 27, 1986

[30] Foreign Application Priority Data

Jan. 25, 1985 [JP] Japan ................................. 60-10763
Nov. 22, 1985 [JP] Japan ................................. 60-261383

[51] Int. Cl.$^4$ ............................................. B05D 3/06
[52] U.S. Cl. ..................................... 428/457; 427/39; 427/122
[58] Field of Search .................... 204/173; 427/38, 39, 427/122; 428/457

[56] References Cited

U.S. PATENT DOCUMENTS 4,271,045  6/1981  Steigerwald et al. ............... 427/122
4,382,100  5/1983  Holland ................................ 427/39
4,444,805  4/1984  Corbett et al. ....................... 427/38
4,504,519  3/1985  Zelez .................................... 427/122

FOREIGN PATENT DOCUMENTS 701901  1/1965  Canada ................................ 427/122

Primary Examiner—John H. Newsome
Attorney, Agent, or Firm—Cushman, Darby & Cushman

[57] ABSTRACT

A method for forming a conductive graphite film comprises the steps of forming a carbon film on substrate material heated to 700° C. or higher through a plasma discharge using hydrocarbon gas as raw material and subjecting the film to heat treatment at temperatures exceeding 1,500° C.

13 Claims, No Drawings

METHOD FOR FORMING CONDUCTIVE GRAPHITE FILM AND FILM FORMED THEREBY

BACKGROUND OF THE INVENTION

This invention relates to a method for forming a conductive graphite film having high conductivity and the same obtained by the method.

The so-called thermal decomposition method is conventionally employed to obtain graphitized carbon. That method comprises thermally decomposing hydrocarbon by heating reacting material to high temperatures in an atmosphere of hydrocarbon as raw material to form carbon materials (for instance, "Foundation of Carbonization Engineering", Ohtani, 1980, Ohom)- (Method 1). The carbon materials are roughly divided into three kinds shown in Table 1 ([Introduction to Carbon Material], Nagaoki, 1979, Society of Carbon Material). The conductivity of graphite A at normal temperatures is $2.5 \sim 5 \times 10^3$ S/cm.

TABLE 1

| Kinds of graphites: | Production temperature: (°C.) | Principal properties: |
|---|---|---|
| A | 2,000~2,200 | high density, high anisotropy |
| B | 1,500~1,700 | low density, low anisotropy |
| C | 1,200~1,400 | low density, low anisotropy (low formation speed) |

It is well known to graphitize the carbon material thus obtained through the above-described method by subjecting it to heat treatment at a high temperature of, for instance, 3,000° C.

Another conventional method often employed comprises carrying out the plasma polymerization of benzene by means of a high-frequency discharge at temperatures lower (1,000° C.) than those in the above-described method to obtain a thin carbon film on a quartz plate or silicon wafer (H. MATSUSHIMA et al, J. APPL. PHYS. Vol. 22 (No. 5), 888 (1982)) (Method 2).

In the above-described method 1, however, a thermal decomposition temperature of 2,000° C. or higher is required as a condition for obtaining high conductive graphitized carbon. Kinds of substrate materials at such high temperatures are limited and energy loss is also large. Accordingly, the formation of graphitized carbon at low temperatures is being desired.

In the method 2, conductivity is less than $10^3$ S/cm, whereas the growth rate of carbon material is 0.052 μm/min, which is extremely low as compared with the growth rate of carbon material (1.7~17 μm/min) in accordance with the heat decomposition method in the method 1.

SUMMARY OF THE INVENTION

In view of the problems of the prior art, an object of the present invention is to provide a method for forming a graphite film whose conductivity is higher than that of the carbon material obtained through the method 2 with less limitation on the kinds of substrate materials on which a carbon film is formed as compared with the method 1.

The method for forming a conductive graphite film according to the present invention is characterized in that a carbon film is formed on a substrate material heated to 700° C. or higher through a plasma discharge using hydrocarbon gas as raw material and the film is subjected to heat treatment at 1,500° C. or higher.

DETAILED DESCRIPTION OF THE INVENTION

Hydrocarbon usable as raw material according to the present invention includes gasifiable substances, for instance, aliphatic compounds $C_nH_{2n+2}$ such as methane, ethane and propane; unsaturated derivatives, i.e., those having more than one double or triple bonds, such as alkene and alkyne; and aromatic compounds such as benzene, naphthalene, anthracene and pyrene. In other words, hydrocarbon giving off vapor at about 1 mmHg is particularly suitable.

The method of forming a carbon film on a substrate through a plasma discharge comprises filling a reaction vessel with hydrocarbon vapor as raw material at fixed pressure and forming the carbon film on a substrate material by applying a high-frequency electric field.

Substrate materials usable according to the present invention may include plates, sheets, films or other molded parts of metal such as iron, cobalt, chrome and nickel or alloy such as stainless steel, and fibers or their fabrics. Materials other than metals, which is composed of quartz, glass, silicon or ceramics, can also be used. Moreover, carbon fibers, carbon sheets (e.g., carbon fiber fabrics), graphite fibers or graphite plates (e.g., HOPG) are usable. Of the above-described substrate materials, one containing transition metal is particularly preferred because it acts as a catalyzer in the graphitizing reaction.

The substrate material will especially be effective for the formation of a carbon film if heated to 700° C. or higher.

According to the first embodiment of the present invention, a carbon film is formed on substrate material and then it is subjected to heat treatment at a temperature exceeding 1,500° C. The heat treatment may be given to the carbon film peeled off the substrate material or the film together with the substrate material. When the substrate material is composed of a substance having a melting point of less than 1,500° C., a graphite film only can be separated simultaneously with heat treatment if the film is subjected to the heat treatment together with the substrate material because the substrate material is fused or volatilized.

According to the second embodiment of the present invention, heat treatment at 2,000° C. or higher is further provided after a carbon film is formed on the substrate material. The heat treatment may be given to the carbon film peeled off the substrate material or the film together with the substrate material. When the substrate material is composed of a substance having a melting point of less than 2,000° C., a graphite film only can be separated simultaneously with heat treatment if the film is subjected to the heat treatment together with the substrate material, because the substrate material is fused or volatilized.

Highly conductive graphite films are formed according to the above-described methods. Their conductivity will be increased further if the graphite films are doped with suitable dopant after heat treatment.

As suitable dopant, there are electron receptive reagents such as halogen (e.g., $Cl_2$, $Br_2$, $I_2$, ICl, $ICl_3$, IBr), Lewis acid, proton acid (e.g., $PF_5$, $AsF_5$, $SbF_5$, $AgClO_4$, $AgBF_4$, $BF_3$, $BCl_3$, $BBr_3$, $FSO_2OOSO_2F$, $(NO_2)(SbF_6)$, $(NO)SbCl_6$, $(NO_2)(BF_4)$, $SO_3$, $TiF_4$, $NbF_5$, $TaF_5$, $NbCl_5$, $TaCl_5$, $MnCl_2$, $MoCl_4$, $MoCl_5$, $MoOCl_4$, $NiCl_2$, $ZnCl_2$, $CrO_2Cl_2$, $FeCl_3$, $CdCl_2$, $AuCl_3$, $CrCl_3$, $AlCl_3$, $AlBr_3$, $GaBr_3$, $PtCl_4$, $SbCl_5$, $UCl_5$, $SoCl_2$, $XeF_6$, $H_2SO_4$, $HClO_4$, $HNO_3$, $FSO_3H$, $CF_3SO_3H$) and electron donative reagents such as Li, Na, K, Rb, Cs.

First embodiment of the present invention will be described in more detail. Table 2 summarizes the results obtained in the first embodiment.

Experiments were made under the following conditions.

Carbon film synthesizing conditions:

A sheet of substrate material (0.2 mm thick) was left at rest within a synthesis chamber and, after the substrate material was heated, benzene vapor was introduced in the synthesis chamber where the pressure was kept at 1.0 mmHg. A high-frequency electric field (13.56 MHz, output 40 W) was applied to carry out plasma reaction. There was thus formed a carbon film having the luster of metal on the substrate material, the film being 20–22 μm thick.

The temperature of the substrate material was then lowered up to the room temperature to peel the carbon film off the substrate material.

Doping conditions:

The graphite film thus obtained was left in $AsF_5$ gas or on fuming nitric acid and subjected to doping.

First, there were used benzene as raw material and SUS 304, which is composed of 18 wt % of Cr, 10 wt % of Ni and 72 wt % of Fe, as the substrate material, which was heated to 1,000° C., and synthesis was carried out without the application of a plasma discharge. Although a fibrous carbon material was obtained, no carbon material in the form of a film was obtained and its conductivity was low. The carbon material was further subjected to the heat treatment at 3,300° C. and doped with $AsF_5$. However, the conductivity of each material thus obtained was still low (Comparative Examples 1 and 2).

Next, synthesis was carried out through the plasma discharge under the same conditions as those in Comparative Examples 1 and 2. As a result, a filmy carbon material was obtained and the conductivity thereof after the synthesis, heat treatment and $AsF_5$ doping was considerably improved (Examples 1, 2).

A silicon substrate was used as the substrate material and synthesis was carried out under the same conditions as those in Example 1. No carbon material offering high conductivity was still obtained (Comparative Example 3).

There are subsequently shown the results of synthesis carried out by changing the temperature applied to the substrate material at the time of synthesis.

Conductivity of the carbon material was dependent on the temperature of substrate material and high conductivity was not obtained unless the substrate material was heated to 1,000° C. or higher (Comparative Examples 4, 5 and Example 3).

Examination was made on the effects of the temperature of the heat treatment when the thin carbon film was heat-treated. Heat treatment at temperatures exceeding 1,500° C. allowed its conductivity to increase by a large amount (Comparative Example 4 and Example 6).

For the thin carbon film synthesized using Mo as the substrate material, high conductivity was not obtained even with heat treatment at 2,000° C. (Comparative Example 7).

As is obvious from comparison with a reference Example 1, the graphite material obtained through the method according to the present invention is seen to have high conductivity even though it is subjected to heat treatment at lower temperatures.

In Example 5, there are shown results where dopant other than $AsF_5$ was used. As compared with the use of $AsF_5$, the effect obtained was little. However, sufficiently high conductivity was obtained.

TABLE 2

|  | Co. Ex. 1 | Co. Ex. 2 | Ex. 1 | Ex. 2 | Co. Ex. 3 | Co. Ex. 4 | Co. Ex. 5 |
|---|---|---|---|---|---|---|---|
| Material | Benzene | Benzene | Benzene | Benzene | Benzene | Benzene | Benzene |
| Plasma discharge | nil | nil | applied | applied | applied | applied | applied |
| Substrate material | SUS 304 | SUS 304 | SUS 304 | SUS 304 | silicon substrate | SUS 304 | SUS 304 |
| Substrate material temperature | 1,000° C. | 1,000° C. | 1,000° C. | 1,000° C. | 1,000° C. | 900° C. | 850° C. |
| Heat treatment temperature | — | 3,000° C. | 2,500° C. | 3,300° C. | 3,300° C. | 3,300° C. | 3,300° C. |
| Doping material | — | $AsF_5$ | — | $AsF_5$ | — | — | — |
| Results Film formation | fibrous without film | fibrous without film | filmy | filmy | filmy | filmy | filmy |
| Conductivity (S/cm):* |  |  |  |  |  |  |  |
| after synthesis | $1.0 \times 10^2$ | — | — | — | — | — | — |
| after heat treatment | — | $1.2 \times 10^2$ | $1.0 \times 10^4$ | $2.2 \times 10^4$ | $7.0 \times 10^2$ | $4.0 \times 10^3$ | $3.0 \times 10^3$ |
| after doping | — | $1.5 \times 10^2$ | — | $9.0 \times 10^5$ | — | — | — |

|  | Ex. 3 | Ex. 4 | Co. Ex. 6 | Co. Ex. 7 | Ref.** Co. Ex. 1 | Ex. 5 |
|---|---|---|---|---|---|---|
| Material | Benzene | Benzene | Benzene | Benzene | Benzene | Benzene |
| Plasma discharge | applied | applied | applied | applied | nil | applied |
| Substrate material | SUS 304 | SUS 304 | SUS 304 | Mo | — | SUS 304 |
| Substrate material temperature | 1,050° C. | 1,000° C. | 1,000° C. | 1,000° C. | 1,100° C. | 1,000° C. |
| Heat treatment | 3,300° C. | 2,000° C. | 1,500° C. | 2,000° C. | 2,000° C. | 3,000° C. |
| Doping material | — | — | — | — | — | $HNO_3$ |

TABLE 2-continued

| Results | Film formation | filmy | filmy | filmy | filmy | fibrous | filmy |
|---|---|---|---|---|---|---|---|
| | Conductivity (S/cm):* | | | | | | |
| | after synthesis | — | — | — | — | $6 \times 10^2$ | — |
| | after heat treatment | $2.5 \times 10^4$ | $7.0 \times 10^3$ | $1.6 \times 10^3$ | $1 \times 10^3$ | $2.0 \times 10^3$ | — |
| | after doping | — | — | — | — | — | $7.8 \times 10^4$ |

*Measured by the four terminal method.
**Reference: Koyama & Endo, Japan. J. Appl. Phys. 13(7) 1175 (1974).

Table 3 shows further examples 6–13 of the first embodiment in which carbon films were formed on various substrate materials heated to 1,000° C. by using benzene as raw material and were subjected to heat treatment at 3,300° C. The conductivity of the films are as shown in Table 3.

As is apparent from Table 3, the conductivity was more than $10^4$ s/cm when a substrate material was stainless steel. Thus the stainless steel is particularly preferable for the substrate material. The highest conductivity was obtained when the substrate material was SUS 304.

TABLE 3

| | substrate material | | conductivity (s/cm) |
|---|---|---|---|
| | Alloy | composition (Wt %) | |
| Example 6 | Monel | Ni: 65, Cu: 33, Fe: 2 | $5.5 \times 10^3$ |
| Example 7 | Nichrome | Ni: 80, Cr: 20 | $8.2 \times 10^3$ |
| Example 8 | Constantan | Cu: 55, Ni: 45 | $4.6 \times 10^3$ |
| Example 9 | Mumetal | Ni: 77, Fe: 16, Cu: 5, Cr: 1.5 | $9.0 \times 10^3$ |
| Example 10 | Inconel | Ni: 72, Cr: 16, Fe: 8, remainder | $9.3 \times 10^3$ |
| Example 11 | SUS 310 | Cr: 25, Ni: 20, Fe: 55 | $1.6 \times 10^4$ |
| Example 12 | SUS 316 | Cr: 18, Ni: 8, Mo: 3, Fe: 71 | $1.1 \times 10^4$ |
| Example 13 | SUS 304 | Cr: 18, Ni: 10, Fe: 72 | $2.2 \times 10^4$ |

Table 4 shows further examples 14–19 of the first embodiment in which carbon films were formed on the substrate material of SUS 304 heated to 1,000° C. by using benzene as raw material and were subjected to heat treatmet at 3,300° C. The carbon films thus obtained were further doped with various dopants.

As is apparent from Table 4, the conductivity of carbon films is raised by doping with dopants. Especially, the electron receptive reagents are preferable, and $AsF_5$ is most preferable.

TABLE 4

| | Dopant | | Conductivity (s/cm) |
|---|---|---|---|
| Example 14 | $AsF_5$ | (electron receptive reagent) | $9.0 \times 10^5$ |
| Example 15 | $SbF_5$ | (electron receptive reagent) | $5.2 \times 10^5$ |
| Example 16 | $HNO_3$ | (electron receptive reagent) | $1.5 \times 10^5$ |
| Example 17 | $SO_3$ | (electron receptive reagent) | $2.4 \times 10^5$ |
| Example 18 | K | (electron donative reagent) | $1.0 \times 10^5$ |
| Example 19 | Na | (electron donative reagent) | $8.9 \times 10^4$ |

Second embodiment of the present invention will be described in detail.

A sheet of substrate material of SUS304 (0.2 mm thick) was left at rest within a synthesis chamber and, after the substrate material was heated to 950° C., benzene vapor was introduced in the synthesis chamber where the pressure was kept at 1.0 mmHg. A high-frequency electric field (13.56 MHz, output 40 W) was applied to carry out plasma reaction. There was thus formed a carbon film having the luster of metal on the substrate material the film being 20–22 μm thick.

The temperature of the substrate material was lowered up to the room temperature to peel the carbon film off the substrate material. Subsequently, the carbon film was subjected to heat treatment at 3,200° C. and a graphite film was obtained (Example 2-1).

The conductivity of the graphite film thus obtained was measured. The result obtained was $1.2 \times 10^4$ S/cm and its conductivity was considerably increased as compared with the conductivity $2.2 \times 10^3$ S/cm of the carbon film before heat treatment. As the result of X-ray diffraction, sharp diffraction lines (002), (004), (006) were observed, thus proving a great deal of progress made in graphitization. Moreover the graphite film had a spacing of d=3.355 Å, which was very close to the spacing d=3.354 Å in the case of natural graphite. This means the crystallinity of the graphite film obtained was excellent and accordingly this graphitization method was effective also with respect to data on characteristics other than conductivity.

The graphite film obtained in Example 2-1 was doped with $AsF_5$ under such doping conditions as $7.98 \times 10^4$ Pa at the room temperature. The conductivity of the graphite film obtained was $1.1 \times 10^5$ S/cm (Example 2-2).

The graphite film obtained in Example 2-1 was left on fuming nitric acid for 21.5 hours and subjected to doping under such doping conditions as 1 atmospheric pressure at the room temperature. The conductivity of the graphite film obtained was $7.8 \times 10^4$ S/cm (Example 2-3).

The graphite film obtained in Example 2-1 was left on fuming sulfuric acid for 5 minutes and subjected to doping under such doping conditions as 1 atmospheric pressure at the room temperature. The conductivity of the graphite film obtained was $2.1 \times 10^4$ S/cm (Example 2-4).

A carbon film was formed under the same conditions as those in Example 2-1 and then subjected to the heat treatment at a temperature of 2,000° C. to obtain a graphite film. The conductivity of the graphite film obtained was $5.0 \times 10^3$ S/cm (Example 2-5).

According to the methods of the present invention for manufacturing conductive graphite films as above described, the following effects are obtained:

(i) Conductivity is superior to that of the carbon or the graphite film obtained through the conventional heat decomposition method or plasma CVD method and conductivity is further improvable by doping the film with dopant.

(ii) Since the carbon film synthetic method is a plasma polymerization method, varieties of graphite films in, thickness, shape and size can be made as compared with those obtained through the heat decomposition method.

(iii) As temperatures at which a carbon film is formed and graphitization is carried out are lower than those in the case of the conventional method, it is possible to use substrate materials having low melting points. Accordingly, there are a wider range of choice of usable materials and wider applications.

What is claimed is:

1. A method for forming a conductive graphite film comprising the steps of forming a carbon film on substrate material heated to 1,000° C. or higher through a plasma discharge using hydrocarbon gas as raw material, said substrate material containing chrome or nickel, and subjecting said film to heat treatment at temperatures exceeding 1,500° C.

2. A method for forming a conductive graphite film as claimed in claim 1, wherein said substrate material is stainless steel.

3. A method for forming a conductive graphite film as claimed in claim 2, wherein said stainless steel is a material selected from the group consisting of SUS 310, SUS 316 and SUS 304.

4. A method for forming a conductive graphite film comprising the steps of forming a carbon film on substrate material heated to 1,000° C. or higher through a plasma discharge using hydrocarbon gas as raw material, said substrate material containing chrome or nickel, subjecting said film to heat treatment at 1,500° C. or higher and doping said film with dopant.

5. A method for forming a conductive graphite film as claimed in claim 4, wherein said substrate material is stainless steel.

6. A method for forming a conductive graphite film as claimed in claim 5, wherein said stainless steel is a material selected from the group consisting of SUS 310, SUS 316 and SUS 304.

7. A method for forming a conductive graphite film as claimed in claim 4, wherein said dopant is an electron receptive reagent.

8. A method for forming a conductive graphite film as claimed in claim 7, wherein said electron receptive reagent is a material selected from the group consisting of $AsF_5$, $SbF_5$, $HNO_3$, and $SO_3$.

9. A method for forming a conductive graphite film comprising the steps of forming a carbon film on substrate material heated to 700° C. of higher through a plasma discharge using hydrocarbon gas as raw material and subjecting said film to heat treatment at 2,000° C. or higher.

10. A method for forming a conductive graphite film as claimed in claim 9, wherein said substrate material contains transition metal.

11. A method for forming a conductive graphite film comprising the steps of forming a carbon film on substrate material heated to 700° C. or higher through a plasma discharge using hydrocarbon gas as raw material, subjecting said film to heat treatment at 2,000° C. or higher and doping said film with dopant.

12. A method for forming a conductive graphite film as claimed in claim 11, wherein said substrate material contains transition metal.

13. Conductive graphite film formed by means of a method comprising the steps of forming a carbon film on substrate material heated to 1,000° C. or higher through a plasma discharge using hydrocarbon gas as raw meterial, said substrare material containing chrome or nickel, and subjecting said film to heat treatment at temperatures exceeding 1,500° C.

* * * * *